United States Patent
Guo et al.

(10) Patent No.: US 7,334,204 B2
(45) Date of Patent: Feb. 19, 2008

(54) SYSTEM FOR AVOIDING FALSE PATH PESSIMISM IN ESTIMATING NET DELAY FOR AN INTEGRATED CIRCUIT DESIGN

(75) Inventors: Weiqing Guo, Fremont, CA (US); Sandeep Bhutani, Pleasanton, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/324,082

(22) Filed: Dec. 29, 2005

(65) Prior Publication Data

US 2007/0157143 A1 Jul. 5, 2007

(51) Int. Cl.
G06F 9/45 (2006.01)
G06F 17/50 (2006.01)

(52) U.S. Cl. ............................................. 716/6
(58) Field of Classification Search ............ 716/6
See application file for complete search history.

(56) References Cited

U.S. PATENT DOCUMENTS

| 2002/0095646 A1* | 7/2002 | Ohkubo ................. 716/6 |
| 2003/0140325 A1* | 7/2003 | Chen et al. ............. 716/6 |
| 2006/0048086 A1* | 3/2006 | Pie et al. ................ 716/6 |
| 2006/0190883 A1* | 8/2006 | Ja et al. .................. 716/6 |

* cited by examiner

Primary Examiner—Jack Chiang
Assistant Examiner—Suresh Memula
(74) Attorney, Agent, or Firm—Eric James Whitesell

(57) ABSTRACT

A system for estimating stage delay in an integrated circuit design includes steps of receiving as input an integrated circuit design including a single stage having at least two inputs, an output, and an interconnect connected to the output; calculating a separate interconnect delay for the interconnect as a function of an input ramptime for each of the inputs; adding a gate delay of each of the inputs to the separate interconnect delay calculated as a function of the input ramptime to estimate a stage delay for each of the inputs; and generating as output the stage delay for each of the inputs.

8 Claims, 5 Drawing Sheets

SYSTEM FOR AVOIDING FALSE PATH PESSIMISM IN ESTIMATING NET DELAY FOR AN INTEGRATED CIRCUIT DESIGN

BACKGROUND OF THE INVENTION

1. Field of the Invention

The present invention is directed to the design and manufacture of integrated circuits. More specifically, but without limitation thereto, the present invention is directed to a method of estimating path delays for static timing analysis of an integrated circuit design.

2. Description of Related Art

Static timing analysis (STA) is generally used to anticipate timing problems in an integrated circuit design before committing the design to silicon. In typical static timing analysis, the worst-case stage delay is estimated for each stage of each net in the design and added together to estimate the net delay for each net.

SUMMARY OF THE INVENTION

A method of estimating stage delay in an integrated circuit design includes steps of:
(a) receiving as input an integrated circuit design including a single stage having at least two inputs, an output, and an interconnect connected to the output;
(b) calculating a separate interconnect delay for the interconnect as a function of an input ramptime for each of the inputs;
(c) adding a gate delay of each of the inputs to the separate interconnect delay calculated as a function of the input ramptime to estimate a stage delay for each of the inputs; and
(d) generating as output the stage delay for each of the inputs.

In another embodiment, a computer program product includes:
a medium for embodying a computer program for input to a computer; and
a computer program embodied in the medium for causing the computer to perform steps of:
(a) receiving as input an integrated circuit design including a single stage having at least two inputs, an output, and an interconnect connected to the output;
(b) calculating a separate interconnect delay for the interconnect as a function of an input ramptime for each of the inputs;
(c) adding a gate delay of each of the inputs to the separate interconnect delay calculated as a function of the input ramptime to estimate a stage delay for each of the inputs; and
(d) generating as output the stage delay for each of the inputs.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Figure 1:
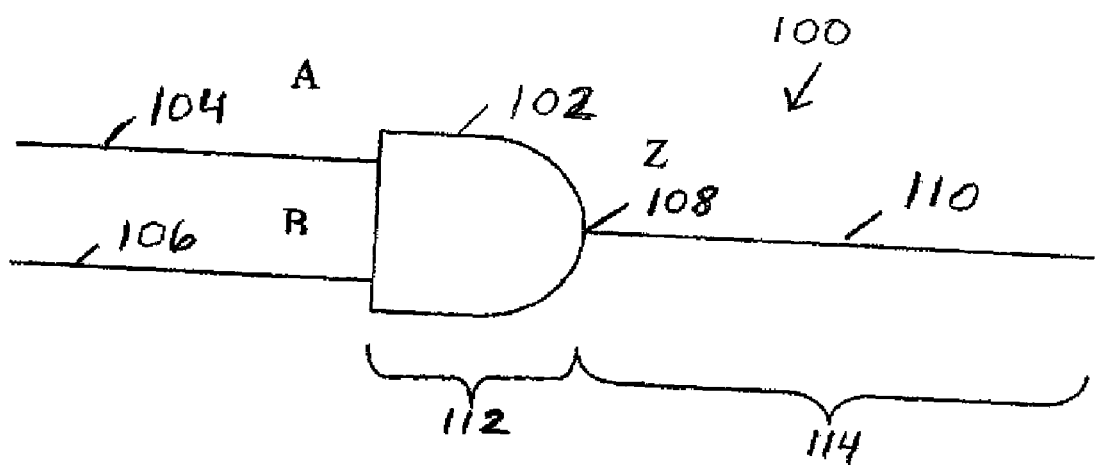
FIG. 1 illustrates a diagram of a model of a stage delay used in static timing analysis of an integrated circuit design according to the prior art.

FIG. 1 illustrates a diagram of a model of a stage delay 100 used in static timing analysis of an integrated circuit design according to the prior art. Shown in FIG. 1 are a gate 102, gate inputs 104 and 106, a gate output 108, a gate interconnect 110, a gate delay 112 and an interconnect delay 114.

In FIG. 1, the stage delay 100 is calculated as the sum of the gate delay 112 and the gate interconnect delay 114. The interconnect delay 114 is a function of the ramptime of the gate output 108 that drives the gate interconnect 110 and the input ramptime of the gate inputs 104 and 106. However, there may be multiple cell arcs that include the gate interconnect 110. For example, the gate 102 has two cell arcs. One cell arc includes the gate input 104 and the gate interconnect 110, and the second cell arc includes the gate input 106 and the gate interconnect 110. Each of these cell arcs can cause a different stage delay at the end of the gate interconnect 110. The cell arc that results in the longest (worst-case) interconnect delay is typically selected to model the gate interconnect delay 114. The stage delay 100 is estimated by adding the worst-case cell delay 112 of the gate 102 to the worst-case interconnect delay 114.

Figure 2:
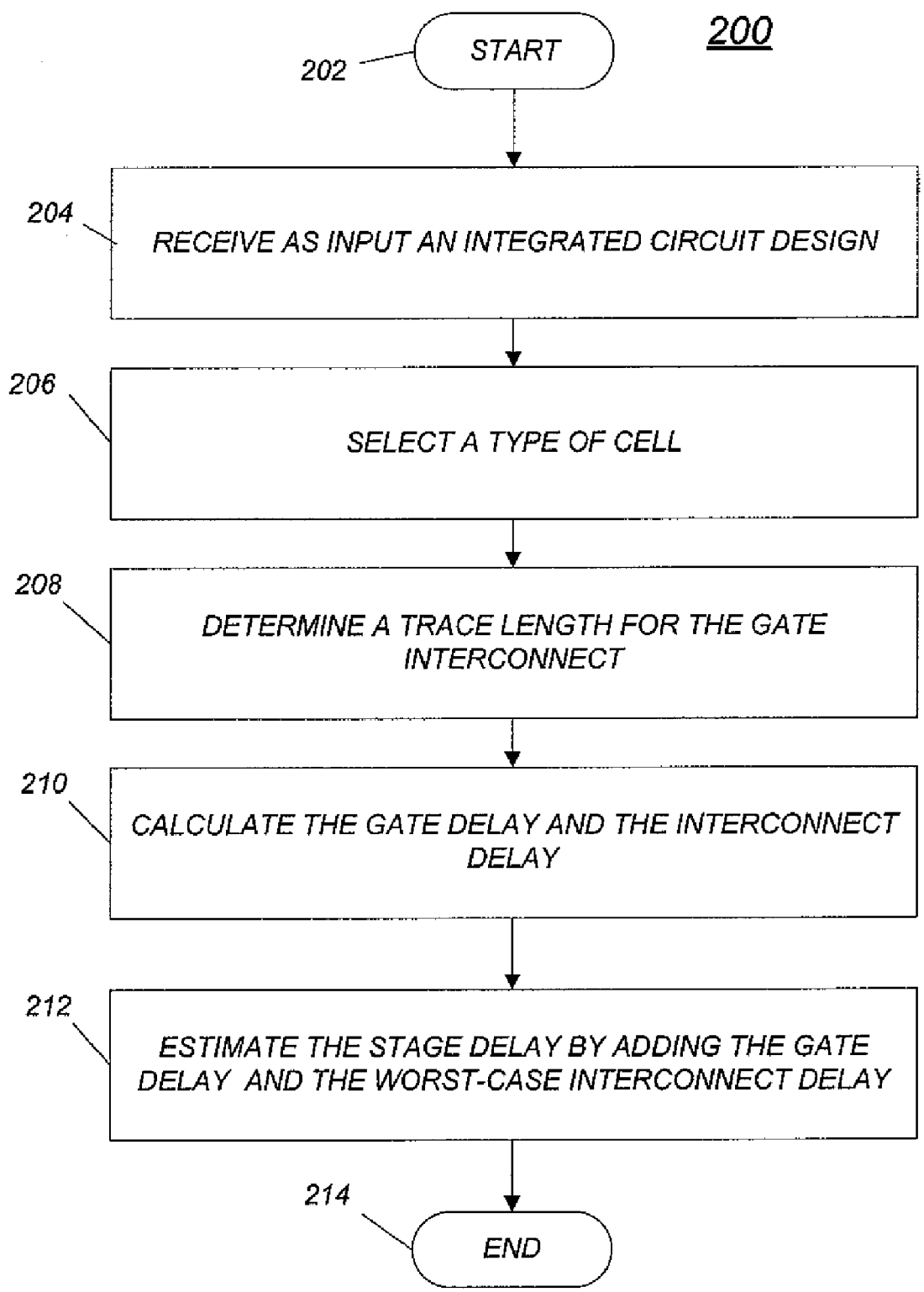
FIG. 2 illustrates a flow chart for a method of estimating stage delay using the stage delay model of FIG. 1.

FIG. 2 illustrates a flow chart 200 for a method of estimating stage delay using the stage delay model of FIG. 1.

Step 202 is the entry point of the flow chart 200.

In step 204, an integrated circuit design is received as input, for example, as a register transfer level (RTL) code file.

In step 206, a type of cell for the gate 102 is selected, for example, from a cell library by a place and route program.

In step 208, a trace length is determined for the gate interconnect 110, for example, using the same place and route program.

In step 210, the gate delay 112 and the interconnect delay 114 are calculated, for example, using an asymptotic waveform evaluation (AWE) program. Each of the gate inputs 104 and 106 has a separate corresponding gate delay 112, or input ramptime. The interconnect delay 114 depends on the input ramptime and is calculated as a function of the worst-case gate delay 112.

In step 212, the stage delay is estimated by adding the gate delay 112 and the worst-case interconnect delay 114, for example, in a static timing analysis (STA) tool.

Step 214 is the exit point of the flow chart 200.

A disadvantage of estimating stage delay by adding the cell delay to the worst-case interconnect delay is that these two delays may never occur together, resulting in an overly pessimistic estimated stage delay during static timing analysis. Consequently, unnecessary resources may be dedicated to correcting timing violations that may never occur. For example, two timing arcs or paths are possible for the example of FIG. 1. The first path is from the gate input 104 to the gate output 108 and through the gate interconnect 110. The second path is from the gate input 106 to the gate output 108 and through the gate interconnect 110. If the worst-case interconnect delay 114 through the gate interconnect 110 results from the path from the gate input 106, then the worst-case interconnect delay 114 never occurs in the path from the gate input 104. As a result, the estimate of the path timing from the gate input 104 is excessively penalized by using the worst case interconnect delay 114 from the gate input 106. For example, if the gate delay 112 from the gate input 104 is 1 ns, and if the interconnect delay 114 from the gate input 104 is 2 ns, then the actual stage delay would be 1 ns+2 ns=3 ns. On the other hand, if the gate delay 112 from the gate input 106 is 5 ns, and if the interconnect delay 114 from the gate input 106 is 7 ns, then the actual stage delay would be 5 ns+7 ns=12 ns. However, using the method of FIG. 2, the estimated stage delay for the gate input 104 would be 1 ns+7 ns=8 ns, grossly overestimating the actual delay of 3 ns. The overestimation of stage delay using the worst-case interconnect delay 114 is called false path pessimism.

A system for estimating stage delay is described below that avoids combinations of gate delay and interconnect delay that cannot occur together, resulting in a more accurate estimate of the stage delay for static timing analysis and fewer timing violations that must be resolved in the integrated circuit design.

In one embodiment, a method of estimating stage delay in an integrated circuit design includes steps of:

(a) receiving as input an integrated circuit design including a single stage having at least two inputs, an output, and an interconnect connected to the output;

(b) calculating a separate interconnect delay for the interconnect as a function of an input ramptime for each of the inputs;

(c) adding a gate delay of each of the inputs to the separate interconnect delay calculated as a function of the input ramptime to estimate a stage delay for each of the inputs; and (d) generating as output the stage delay for each of the inputs.

Figure 3:
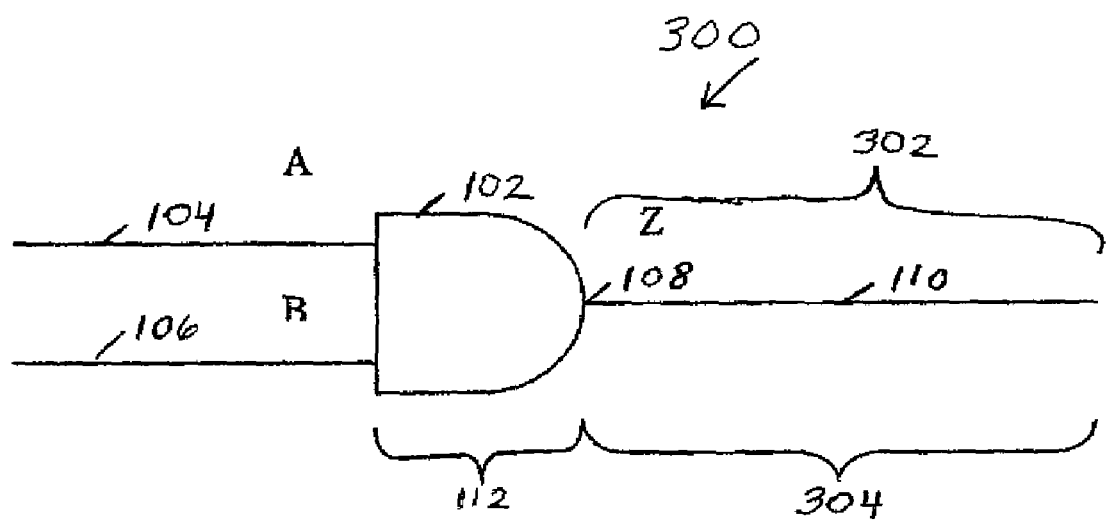
FIG. 3 illustrates a diagram of a model of a stage delay that includes a separate stage delay calculated for each timing arc through the stage.

FIG. 3 illustrates a diagram of a model of a stage delay 300 that includes a separate stage delay calculated for each timing arc through the stage. Shown in FIG. 3 are a gate 102, gate inputs 104 and 106, a gate output 108, a gate interconnect 110, a gate delay 112, and interconnect delays 302 and 304.

In FIG. 3, the gate 102 is an AND gate. In other embodiments, the gate 102 may be another logical function, for example, an OR gate, an XOR (exclusive-OR) gate, or a MUX gate (multiplexer), or the negation of a logical function. The gate 102 includes the separate interconnect delays 302 and 304, one for each of the two gate inputs 104 and 106. In other embodiments, the gate 102 may have more than two gate inputs and a correspondingly greater number of interconnect delays.

The interconnect delay 302 is calculated as a function of the input ramptime of the gate input 104, and the interconnect delay 304 is calculated as a function of as a function of the gate input 106 according to well-known techniques, for example, in the same manner used to calculate the interconnect delay 114 in FIG. 1. The stage delay 300 for the gate input 104 is then calculated by summing the gate delay 112 of the gate 102 from the gate input 104 and the corresponding interconnect delay 302, and the stage delay for the gate input 106 is calculated by summing the gate delay 112 from the gate input 106 of the gate 102 and the corresponding interconnect delay 304. The resulting stage delay 300 is a vector, that is, the stage delay 300 has a separate value for each of the interconnect delays 302 and 304. In this example, the stage delay 300 has two values, one for each of the two gate inputs 104 and 106.

In the model of FIG. 3, the stage delay for each input is estimated from the interconnect delay calculated for that same input, rather than using the worst-case delay of all possible interconnect delays as in the model of FIG. 1. As may be appreciated from FIG. 3, estimating stage delays according to the model of FIG. 3 results in a significant reduction in pessimism in predicting timing violations during static timing analysis, especially for large integrated circuit designs that include millions of stages. The stage delay estimates are not only less pessimistic, but also are more accurate, advantageously providing a savings in re-design resources that would otherwise be expended in correcting timing violations that can never occur in the integrated circuit design.

Figure 4:
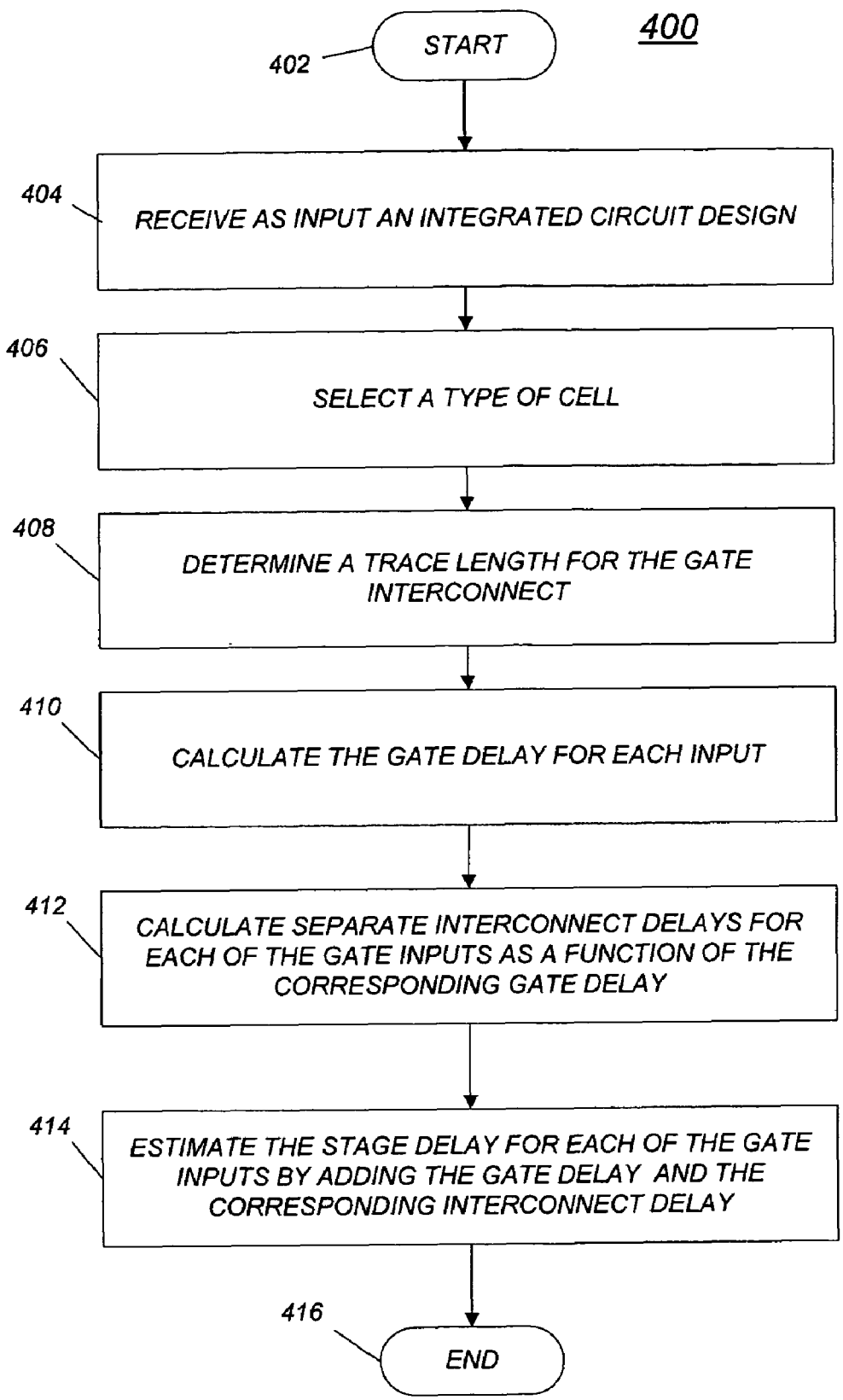
FIG. 4 illustrates a flow chart for a method of estimating stage delay using the stage delay model of FIG. 3.

FIG. 4 illustrates a flow chart 400 for a method of estimating stage delay using the stage delay model of FIG. 3.

Step 402 is the entry point of the flow chart 200.

In step 404, an integrated circuit design is received as input, for example, in the same manner as in FIG. 2.

In step 406, a type of cell for the gate 102 is selected, for example, in the same manner as in FIG. 2.

In step 408, a trace length is determined for the gate interconnect 110, for example, in the same manner as in FIG. 2.

In step 410, the gate delay 112 is calculated for each of the gate inputs 104 and 106, for example, using an asymptotic waveform evaluation (AWE) program.

In step 412, separate interconnect delays 302 and 304 are calculated for each of the gate inputs 104 and 106 as a function of the corresponding gate delay 112.

In step 414, the stage delay for each of the gate inputs 104 and 106 is estimated by adding the gate delay 112 and the corresponding interconnect delay 302 or 304.

Step 416 is the exit point of the flow chart 400.

In practice, only one interconnect delay per stage is allowed in typical static timing analysis due to the limitations of the standard delay format (SDF) file received as input by the static timing analysis tool. To avoid this problem, the delay predictor used to calculate the gate delay and the interconnect delay may calculate and store the stage delay for each input as the gate delays in the standard delay format file and set the worst-case interconnect delay to zero. The static timing analysis (STA) tool may then add the gate delay values and the worst-case interconnect delay value in the usual fashion to reproduce the improved estimate of the stage delay for each input.

Figure 5:
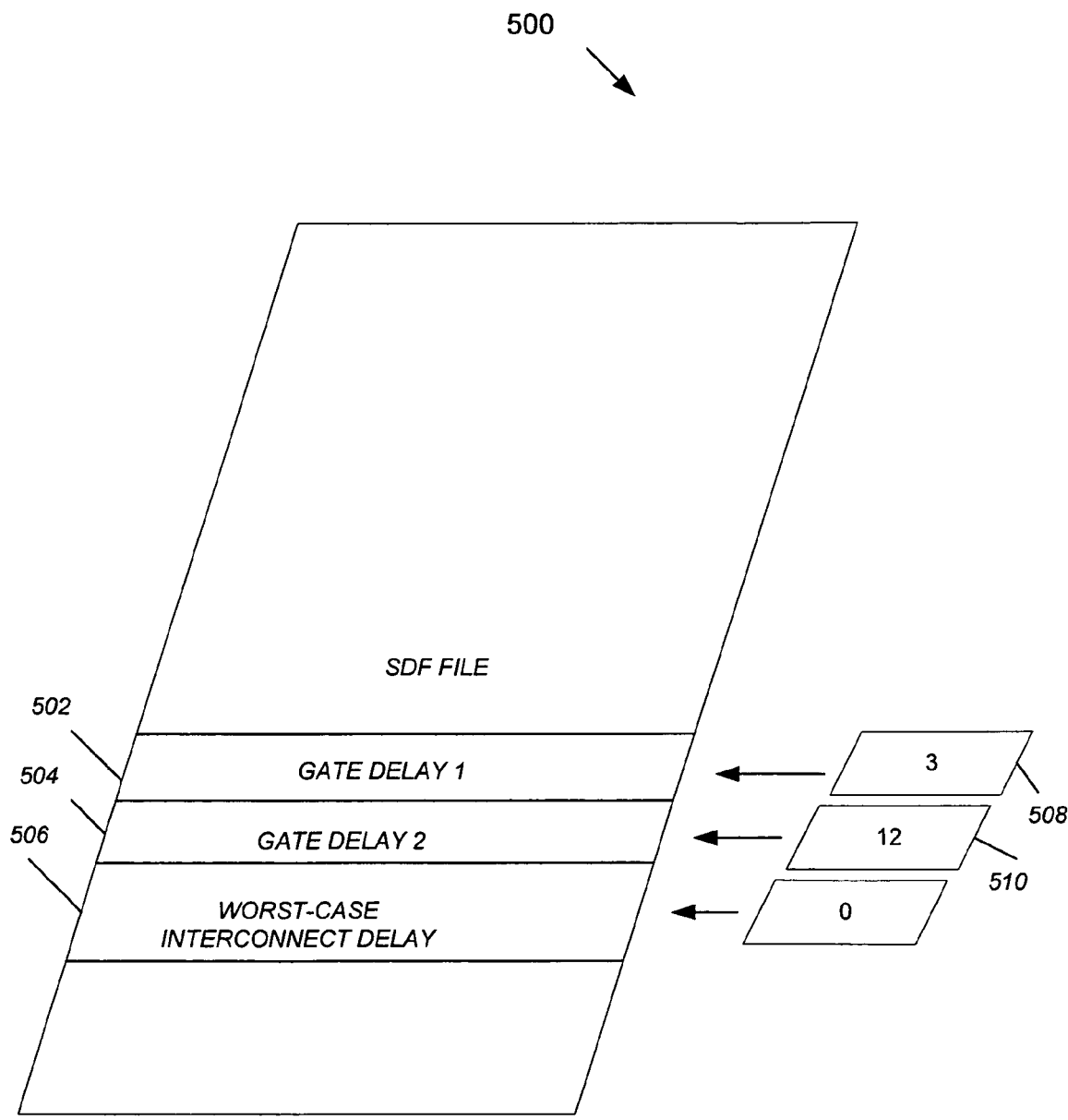
FIG. 5 illustrates a diagram of a portion of a standard delay format file for the method of FIG. 4.

FIG. 5 illustrates a diagram of a portion of a standard delay format file 500 modified for the method of FIG. 4. Shown in FIG. 5 are a gate delay location 502 for a first input, a gate delay location 504 for a second input, a worst-case stage interconnect delay location 506, An estimated stage delay value 508 for the first input, and an estimated stage delay value 510 for the second input.

In FIG. 5, the stage delay values 508 and 510 estimated according to the method of FIG. 4 are saved in the gate delay locations 502 and 504 respectively, and the worst-case stage interconnect delay location 506 is set to zero.

For example, if the gate delay for the first input has a value of 1 ns and the corresponding interconnect delay has a value of 2 ns, then the estimated stage delay value 508 for the first input is 3 ns. Similarly, if the gate delay for the second input has a value of 5 ns and the corresponding interconnect delay has a value of 7 ns, then the stage delay value 510 for the second input is 12 ns. The first gate delay location 502 is set to 3 ns, the second gate delay location 504 is set to 12 ns, and the worst-case stage interconnect delay location 506 is set to zero in the standard delay format file 500.

The flow chart described above may also be automated by instructions for a computer. The instructions may be embodied in a disk, a CD-ROM, and other computer readable media according to well known computer programming techniques.

In another embodiment, a computer program product includes:
a medium for embodying a computer program for input to a computer; and
a computer program embodied in the medium for causing the computer to perform steps of:
(a) receiving as input an integrated circuit design including a single stage having at least two inputs, an output, and an interconnect connected to the output;
(b) calculating a separate interconnect delay for the interconnect as a function of an input ramptime for each of the inputs;
(c) adding a gate delay of each of the inputs to the separate interconnect delay calculated as a function of the input ramptime to estimate a stage delay for each of the inputs; and
(d) generating as output the stage delay for each of the inputs.

Figure 6:
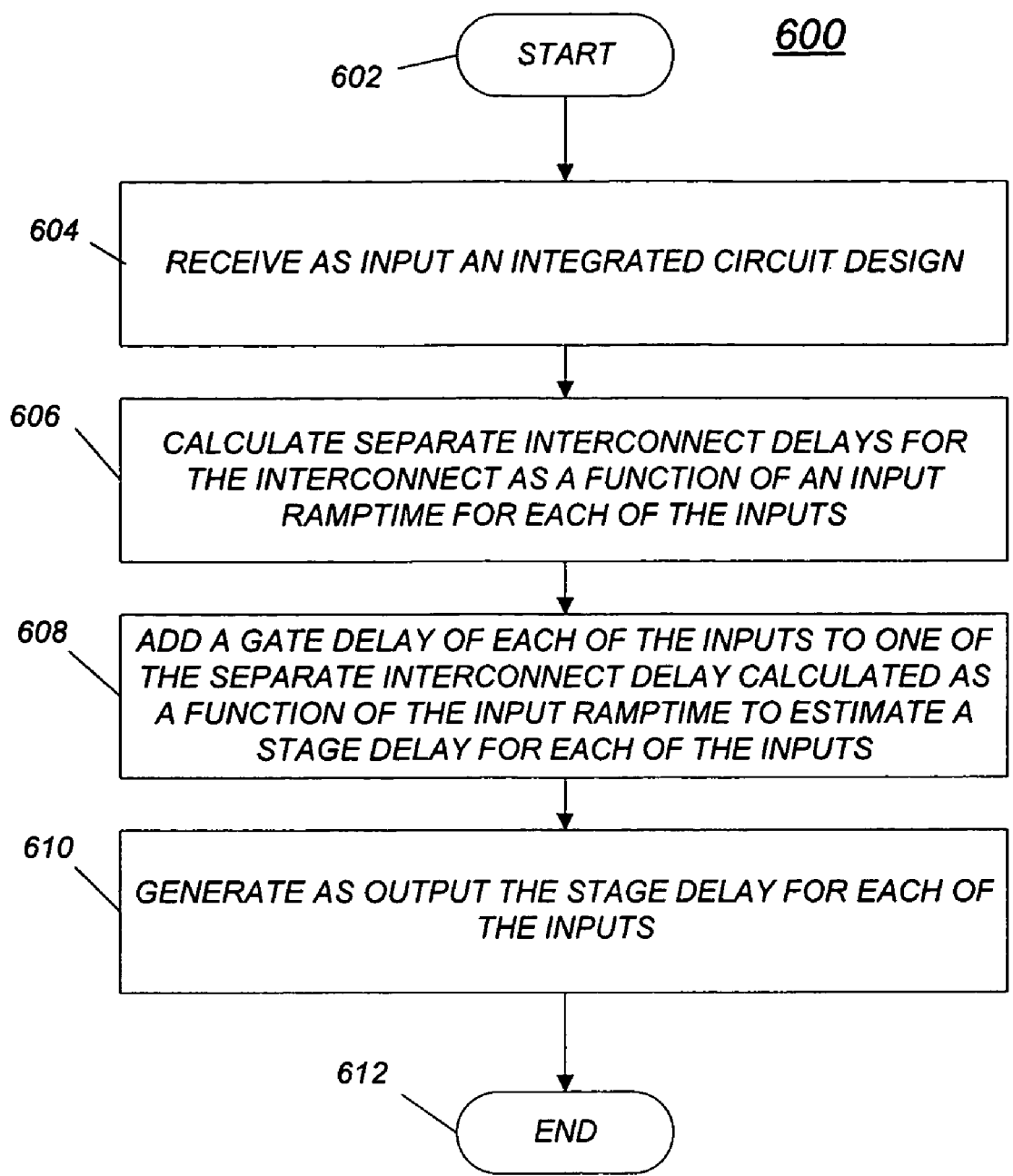
FIG. 6 illustrates a flow chart for a computer program that summarizes the method of FIG. 4.

FIG. 6 illustrates a flow chart 600 for a computer program that summarizes the method of FIG. 4.

Step 602 is the entry point of the flow chart 600.

In step 604, an integrated circuit design is received as input including a single stage having at least two inputs, an output, and an interconnect connected to the output.

In step 606, separate interconnect delays are calculated for the interconnect as a function of an input ramptime for each of the inputs according to well-known techniques.

In step 608, a gate delay of each input is added to the separate interconnect delay calculated as a function of the input ramptime of the input to estimate a stage delay for each of the inputs.

In step 610, the stage delay for each of the inputs is generated as output.

Step 612 is the exit point of the flow chart 600.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:
   (a) receiving as input an integrated circuit design including a single stage having at least two inputs, an output, and an interconnect connected to the output;
   (b) calculating a separate interconnect delay for the interconnect as a function of an input ramptime for each of the inputs;
   (c) estimating a stage delay for each of the inputs by adding a gate delay of each of the inputs to the separate interconnect delay for each of the inputs;
   (d) generating as output the stage delay for each of the inputs; and
   (e) setting a gate delay value equal to the stage delay for each of the inputs in a standard delay format file.

2. The method of claim 1 wherein the stage comprises a logical function.

3. The method of claim 2 wherein the stage comprises one of an AND gate, an OR gate, an XOR gate, and a MUX gate.

4. The method of claim 1 further comprising a step of setting a stage interconnect delay value equal to zero in a standard delay format file.

5. A computer readable storage medium tangibly embodying instructions for a computer that when executed by the computer implement a method comprising steps of:
   (a) receiving as input an integrated circuit design including a single stage having at least two inputs, an output, and an interconnect connected to the output;
   (b) calculating a separate interconnect delay for the interconnect as a function of an input ramptime for each of the inputs;
   (c) estimating a stage delay for each of the inputs by adding a gate delay of each of the inputs to the separate interconnect delay calculated for each of the inputs; and
   (d) generating as output the stage delay for each of the inputs; and
   (e) setting a gate delay value equal to the stage delay for each of the inputs in a standard delay format file.

6. The computer readable storage medium of claim 5 wherein the stage comprises a logical function.

7. The computer readable storage medium of claim 6 wherein the stage comprises one of an AND gate, an OR gate, an XOR gate, and a MUX gate.

8. The computer readable storage medium of claim 5 further comprising a step of setting a stage interconnect delay value equal to zero in a standard delay format file.

* * * * *